United States Patent
Smola et al.

(10) Patent No.: US 6,388,320 B2
(45) Date of Patent: May 14, 2002

(54) VERTICALLY INTEGRATED SEMICONDUCTOR CONFIGURATION

(75) Inventors: Michael Smola, München; Andreas Kux, Haar, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/897,278

(22) Filed: Jul. 2, 2001

Related U.S. Application Data

(63) Continuation of application No. PCT/DE99/04056, filed on Dec. 21, 1999.

(30) Foreign Application Priority Data

Dec. 30, 1998 (DE) .......................................... 198 60 819

(51) Int. Cl.$^7$ ........................... H01L 23/04; H01L 23/34
(52) U.S. Cl. ....................... 257/724; 257/698; 257/725; 257/621
(58) Field of Search ............................... 257/698, 724, 257/725, 621

(56) References Cited

U.S. PATENT DOCUMENTS

| | | | |
|---|---|---|---|
| 4,774,632 A | | 9/1988 | Neugebauer |
| 5,382,827 A | * | 1/1995 | Wang et al. ................. 257/528 |
| 5,793,105 A | * | 8/1998 | Pace .......................... 257/700 |
| 5,825,080 A | | 10/1998 | Imaoka et al. |

FOREIGN PATENT DOCUMENTS

| | | |
|---|---|---|
| EP | 0238089 A2 | 9/1987 |
| EP | 0827203 A2 | 3/1998 |

OTHER PUBLICATIONS

"Mirror Imageable Random Access Memory Ball Grid Array" IBM Technical Disclosure Bulletin vol. 38, No. 01, Jan. 1995, pp. 137–138.

* cited by examiner

*Primary Examiner*—Ngân V. Ngô
(74) *Attorney, Agent, or Firm*—Laurence A. Greenberg; Werner H. Stemer; Gregory L. Mayback

(57) ABSTRACT

A semiconductor configuration includes at least one semiconductor chip having a first chip side, a second chip side, and connections passing through the at least one semiconductor chip, active structures on the first chip side and the second chip side, the connections electrically connecting the active structures to one another, a support having a first support side, a second support side, plated-through holes, and non-conducting regions running alternately with regular spacings from the first support side to the second support side, the plated-through holes spaced apart from one another to define a hole spacing distance between the holes, contact connections connecting the second chip side to the first support side, the contact connections spaced apart from one another to define a connection spacing distance between the contact connections, and the hole spacing distance being smaller than the connection spacing distance.

14 Claims, 1 Drawing Sheet

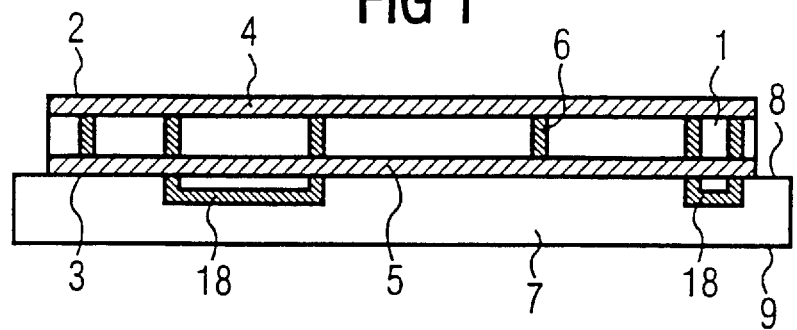
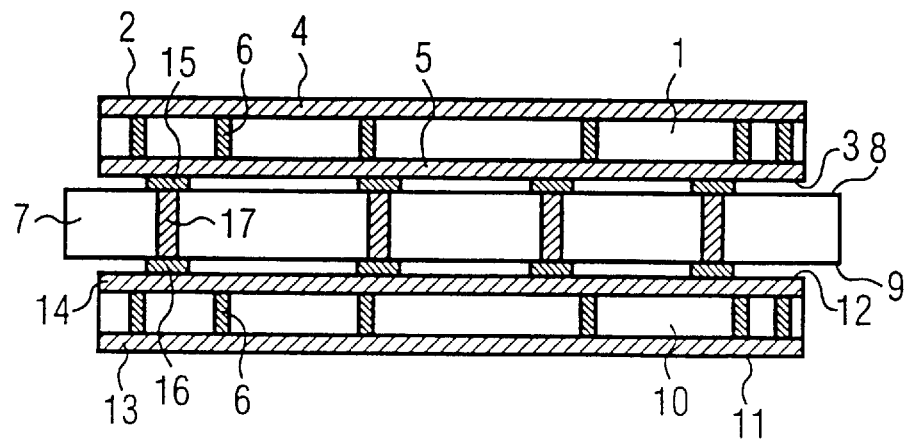
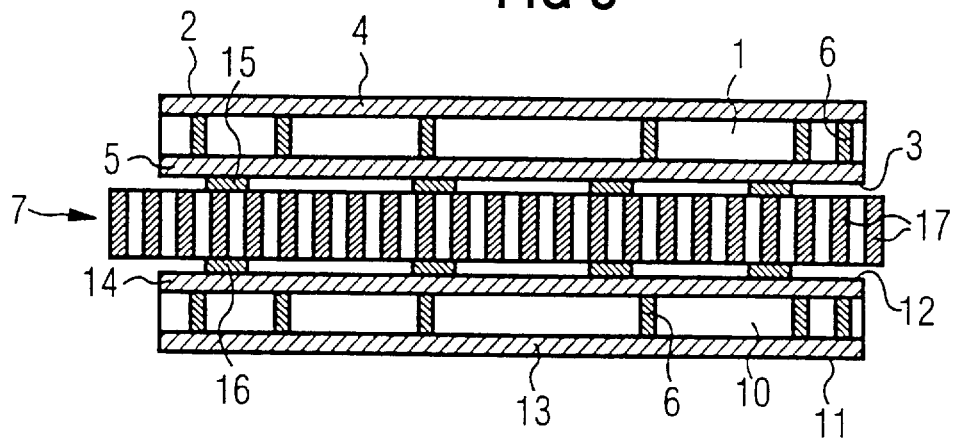

VERTICALLY INTEGRATED SEMICONDUCTOR CONFIGURATION

CROSS-REFERENCE TO RELATED APPLICATION

This application is a continuation of copending International Application No. PCT/DE99/04056, filed Dec. 21, 1999, which designated the United States.

BACKGROUND OF THE INVENTION

Field of the Invention

In the context of new technologies, thinning semiconductor chips by grinding is of interest, e.g., to be able to mount stacks of a plurality of semiconductor chips on top of one another. For such a purpose, the semiconductor chips are thinned by grinding to such an extent that through-plating for connecting two or more layers is made possible. In addition to the possibility of handling semiconductor chip stacks having a small structural height, the through-plating of such ground-thin semiconductor chips can also be used to utilize the rear side of the semiconductor chips for circuit structures. Such use is of interest principally in the field of security and smart card ICs, because active protective structures against physical attacks can be realized (e.g., rear-side protection plate).

For such a purpose, contemporary semiconductor chips are ground to a thickness of 15-20 $\mu$m. The consequence of such grinding is that it becomes relatively difficult to further process the resulting semiconductor chips. On one hand, the semiconductor chips can "roll up", and, on the other hand, mounting on conventional supports is relatively difficult. Furthermore, strain could occur between the layers of a stack, which, in the worst case, leads to a reduced thermal loading capacity of the configuration.

Stacks described above are already used in high-performance computers, but such use is associated with considerable costs in the handling and mounting of the chips. To avoid the above-described handling problems, that is to say, during production, temporary supports are used that are connected to the semiconductor chip only during mounting and are removed after the semiconductor chip stack has been joined together. In addition to the high costs, the complicated production method, which proceeds with a large number of method steps, is not tenable for low-cost applications.

SUMMARY OF THE INVENTION

It is accordingly an object of the invention to provide a vertically integrated semiconductor configuration that overcomes the hereinafore-mentioned disadvantages of the heretofore-known devices of this general type and that has ground-thin semiconductor chips that can be produced cost-effectively.

With the foregoing and other objects in view, there is provided, in accordance with the invention, a semiconductor configuration, including at least one semiconductor chip having a first chip side, a second chip side, and connections passing through the semiconductor chip, active structures on the first chip side and the second chip side, the connections electrically connecting the active structures to one another, a support having a first support side, a second support side, plated-through holes, and non-conducting regions running alternately with regular spacings from the first support side to the second support side, the plated-through holes spaced apart from one another to define a hole spacing distance between the holes, contact connections connecting the second chip side to the first support side, the contact connections spaced apart from one another to define a connection spacing distance between the contact connections, and the hole spacing distance being smaller than the connection spacing distance.

A semiconductor configuration having at least one semiconductor chip with a first and a second main side is proposed. The active structures are connected to one another by connections passing through the semiconductor chip and the chip is configured with one of the main sides on a first side of a support.

What is proposed, then, is to mount ground-thin semiconductor chips permanently on a cost-effective support. The mounting unites the advantages of the through-plating connection of active structures and the requisite small material thickness of the semiconductor chip with a good mechanical stability. In contrast to the prior art, the support remains in the semiconductor configuration, thereby ensuring good handleability during production. As such, it is possible to configure a plurality of chips on the first main side of the support.

In accordance with another feature of the invention, there is provided on the second main side—opposite to the first—of the support at least one further semiconductor chip having active structures on its first and second main sides, which faces the support with one of its main sides and lie opposite the semiconductor chip on the first main side of the support. The semiconductor configuration is provided in the form of a "sandwich" structure on both sides of the support. The sandwich enables a semiconductor configuration that requires only little space.

In accordance with a further feature of the invention, the support has contact connections on the first and/or the second main side, which contact connections are connected to contacts of the semiconductor chips of the active structure. The support can, thus, be used for accommodating simple passive connecting structures. In accordance with an added feature of the invention, the support has passive connecting structures. As a result, on one hand, the complexity of the active layers can be reduced and, on the other hand, a high degree of security against the separation of active structures and the support can be ensured. It is, thus, possible to connect contacts of a semiconductor chip through the passive connecting structure in the support or, alternatively, to connect contacts of different semiconductor chips through the passive connecting structure in the support. The connecting structures may be provided in one or in a plurality of planes in the support.

For such a purpose, in accordance with yet another feature of the invention, either the contact connections on the first main side of the support are connected to one another and/or the contact connections on the second main side of the support are connected to one another and/or the contact connections on the first and the second main side of the support are connected to one another through plated-through holes. The electrical connection between two semiconductor chips that are situated on the opposite main sides of the support can be realized through plated-through holes in the support. In security-relevant applications, it is advantageous if the functionality of the semiconductor configuration is ensured only when at least two semiconductor chips are electrically connected to one another. The interconnected contacts of the semiconductor chips are then advantageously respectively situated on the sides of the semiconductor chips that face the support. If the contacts between one of the semiconductor chips and the support were interrupted, the circuits realized on the semiconductor chips would no longer be functional. It is, thus, possible to prevent examination of the charge potentials produced on the lines.

In accordance with an additional feature of the invention, the support has plated-through holes and non-conducting regions running with regular spacings from the first to the second main side. The advantage of the configuration is that a universal support can be used, regardless of the position of the contacts on the active areas of the semiconductor chips, if the corresponding minimum spacings of the contacts of the semiconductor chips are complied with.

In accordance with a concomitant feature of the invention, the support is advantageously embodied as a semiconductor wafer. A semiconductor wafer serving as support can be produced cost-effectively and, moreover, has the advantage that the layer thickness can be chosen in accordance with the mechanical requirement, without influencing the technological boundary conditions of the active layer in the process. The configuration also applies, of course, to any other support, for example, made of a plastic or a ceramic. A semiconductor wafer as support additionally has the advantage that it can be connected to the semiconductor chips in a particularly simple manner. Moreover, the thermal expansion coefficients are matched to one another.

Other features that are considered as characteristic for the invention are set forth in the appended claims.

Although the invention is illustrated and described herein as embodied in a vertically integrated semiconductor configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a cross-sectional view of a first exemplary embodiment of the semiconductor configuration according to the invention having a semiconductor chip on one main side of a support;

FIG. 2 is a cross-sectional view of a second exemplary embodiment of the semiconductor configuration according to the invention having semiconductor chips on both main sides of a support; and FIG. 3 is a cross-sectional view of a third exemplary embodiment of a semiconductor configuration according to the invention, with an embodiment of the through-plating of a support.

DESCRIPTION OF THE PREFERRED EMBODIMENTS

In all the figures of the drawing, sub-features and integral parts that correspond to one another bear the same reference symbol in each case.

Referring now to the figures of the drawings in detail and first, particularly to FIG. 1 thereof, there is shown the simplest structure of a semiconductor configuration according to the invention. A semiconductor chip 1 is applied on a first main side 8 of a support 7. The semiconductor chip 1 has an active structure 4 on a first main side 2. An active structure 5 is likewise applied on a second main side 3. The second main side 3 of the semiconductor chip 1 is connected to the first main side 8 of the support 7. The active structures 4, 5 of the semiconductor chip 1 are connected to one another through a plurality of connections 6 extending from the first to the second main side 2, 3.

The semiconductor chip 1 is a ground-thin semiconductor chip having a thickness of from 15 to 20 $\mu$m, for example. The support has a thickness of 100 $\mu$m, for example. The layer thickness of the support can be chosen in accordance with the mechanical requirements. Because the support 7 is not conductive, there is no need to take the technological boundary conditions of the active layer 5 into consideration.

Furthermore, the support 7 in FIG. 1 has a connecting structure 18 that, in the present example, connects non-illustrated contacts of the semiconductor chip 1 to one another. The support 7 can have one or even a plurality of additional wiring layers. Such layers make it possible to reduce the complexity of the wiring in the active structure of the semiconductor chip 1. The connection between the support 7 and the semiconductor chip 1 can be effected by bonding or lamination, for example. The connection can, of course, also be effected in any other suitable manner.

What is essential in the case of the invention is the fact that the ground-thin semiconductor chip and the support 7 are permanently connected to one another. Such connection enables simple handling of the semiconductor chip and avoids the disadvantages that occur in the prior art. As a result, semiconductor chips or semiconductor chip stacks, provided with active layers on both main sides, are also opened up for low-cost applications.

FIG. 2 shows a second exemplary embodiment of the semiconductor configuration according to the invention. On a support 7, a semiconductor chip 1 and a semiconductor chip 10 are now respectively applied on a first main side 8 and also on a second main side 9, respectively. The support 7 then has contact connections 15, 16 on the first and also on the second main side 8, 9, respectively. The contact connections 15, 16 are connected to one another through plated-through holes 17 and produce an electrical connection between the active structure 5 of the semiconductor chip 1 and the active structure 14 of the semiconductor chip 10 (having corresponding first and second main sides 11, 12 and another active structure 13). The resulting spacing between the semiconductor chips 1, 10 and the support 7 on account of the contact connections 15, 16 can be filled, for example, with a non-illustrated underfiller.

The semiconductor chip 1 and the semiconductor chip 10 are disposed on the support 7 such that their edges lie opposite one another, that is to say, the edges of the respective semiconductor chips terminate approximately flush with one another. As a result, it is possible to produce a semiconductor configuration with small external dimensions.

In the exemplary embodiments shown in FIGS. 1 and 2, in each case only one semiconductor chip is illustrated on the main sides of the support 7. It is conceivable, of course, to dispose a plurality of semiconductor chips next to one another both on the first and on the second main side 8, 9 of the support 7. The chips can be connected to one another, for example, through connecting structures in the support 7. In such a case, the connecting structures may be configured such that they interconnect the contacts of a plurality of semiconductor chips on a main side of the support. However, the connecting structure may also be configured such that, as shown in FIG. 1, it only interconnects contacts of one semiconductor chip.

It is also conceivable for a plurality of the semiconductor configurations shown in FIGS. 1 and 2 to be stacked one above the other. In such a case, the active structures of two semiconductor chips would be connected to one another. The layer sequence of such a semiconductor configuration would then include, for example, a semiconductor chip/support/semiconductor chip/semiconductor chip/support/semiconductor chip. Because each of the "basic modules" (including a support and a semiconductor chip or one applied on both sides) has a high stability when considered by itself, it is now possible for the active structures of two semiconductor chips to be directly connected to one another.

It would now also be conceivable to apply to a "basic module" in accordance with one of the exemplary embodiments shown merely a further ground-thin semiconductor chip provided with active structures on one side or on both sides, the chip being applied to the active structure of a semiconductor chip of the "basic modules".

FIG. 3 shows a third exemplary embodiment of the semiconductor configuration according to the invention. The third configuration differs from the semiconductor configuration shown in FIG. 2 merely by the fact that the support includes a regular structure of vertical, that is to say, running from the first to the second main side 8, 9 of the support 7, alternately conducting (plated-through hole 17) and non-conducting regions. In such a case, the contacts of the semiconductor chips and the contact connections on the support do not have to be oriented relative to one another. It is possible to use a universal support that can be used regardless of the position of the contacts on the semiconductor chips. In such a case, it is merely necessary to ensure that the corresponding minimum spacings of the contacts on the semiconductor chips are complied with, so that no short circuit between two contacts of a semiconductor chip is established through the plated-through holes 17.

The invention enables a semiconductor configuration that makes it possible for semiconductor chips that are structured on both sides to be disposed one above the other, enabling simple and cost-effective handling during the production of the semiconductor configuration. The semiconductor configuration according to the invention has good mechanical properties. At the same time, a small layer thickness is made possible due to the ground-thin semiconductor chips.

We claim:

1. A semiconductor configuration, comprising:
    at least one semiconductor chip having a first chip side, a second chip side, and connections passing through said at least one semiconductor chip;
    active structures on said first chip side and said second chip side, said connections electrically connecting said active structures to one another;
    a support having a first support side, a second support side, plated-through holes, and non-conducting regions running alternately with regular spacings from said first support side to said second support side, said plated-through holes spaced apart from one another to define a hole spacing distance between respective ones of said plated-through holes;
    contact connections connecting said second chip side to said first support side, said contact connections spaced apart from one another to define a connection spacing distance between respective ones of said contact connections; and
    said hole spacing distance being smaller than said connection spacing distance.

2. The semiconductor configuration according to claim 1, wherein said second support side is opposite said first support side, and at least one further semiconductor chip has:
    a first further chip side;
    a second further chip side; and
    active structures on said first further chip side and said second further chip side; and
    said at least one further semiconductor chip is disposed on said second support side.

3. The semiconductor configuration according to claim 1, wherein
    said support has contact connections on at least one of said first support side and said second support side;
    said active structures have structure contacts; and
    said contact connections are connected to said structure contacts.

4. The semiconductor configuration according to claim 2, wherein
    said support has contact connections on at least one of said first support side and said second support side;
    said active structures have structure contacts; and
    said contact connections are connected to said structure contacts.

5. The semiconductor configuration according claim 1, wherein said support has passive connecting structures.

6. The semiconductor configuration according to claim 3, wherein at least one of:
    said contact connections on said first support side are connected to one another;
    said contact connections on said second support side are connected to one another; and
    said contact connections on said first support side and said second support side are connected to one another through said plated-through holes.

7. The semiconductor configuration according to claim 4, wherein at least one of:
    said contact connections on said first support side are connected to one another;
    said contact connections on said second support side are connected to one another; and
    said contact connections on said first support side and said second support side are connected to one another through said plated-through holes.

8. The semiconductor configuration according to claim 2, wherein said support has plated-through holes and non-conducting regions running alternately with regular spacings from said first support side to said second support side.

9. The semiconductor configuration according to claim 3, wherein said support has plated-through holes and non-conducting regions running alternately with regular spacings from said first support side to said second support side.

10. The semiconductor configuration according to claim 4, wherein said support has plated-through holes and non-conducting regions running alternately with regular spacings from said first support side to said second support side.

11. The semiconductor configuration according to claim 5, wherein said support has plated-through holes and non-conducting regions running alternately with regular spacings from said first support side to said second support side.

12. The semiconductor configuration according to claim 6, wherein said support has plated-through holes and non-conducting regions running alternately with regular spacings from said first support side to said second support side.

13. The semiconductor configuration according to claim 7, wherein said support has plated-through holes and non-conducting regions running alternately with regular spacings from said first support side to said second support side.

14. The semiconductor configuration according to claim 1, wherein said support is a semiconductor wafer.

* * * * *